United States Patent
Palla et al.

(10) Patent No.: US 11,205,575 B2
(45) Date of Patent: Dec. 21, 2021

(54) METHOD FOR STRIPPING ONE OR MORE LAYERS FROM A SEMICONDUCTOR WAFER

(71) Applicant: Texas Instruments Incorporated, Dallas, TX (US)

(72) Inventors: Byron Joseph Palla, Murphy, TX (US); Stephen Alan Keller, Plano, TX (US); Brian Edward Hornung, Richardson, TX (US); Brian K. Kirkpatrick, Allen, TX (US); Douglas Ticknor Grider, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/552,321

(22) Filed: Aug. 27, 2019

(65) Prior Publication Data
US 2020/0343099 A1 Oct. 29, 2020

Related U.S. Application Data

(60) Provisional application No. 62/838,034, filed on Apr. 24, 2019.

(51) Int. Cl.
| | |
|---|---|
| *H01L 21/311* | (2006.01) |
| *H01L 21/302* | (2006.01) |
| *H01L 21/762* | (2006.01) |
| *H01L 27/105* | (2006.01) |
| *H01L 27/11573* | (2017.01) |

(52) U.S. Cl.
CPC ...... *H01L 21/31111* (2013.01); *H01L 21/302* (2013.01); *H01L 21/76224* (2013.01); *H01L 27/1052* (2013.01); *H01L 27/11573* (2013.01)

(58) Field of Classification Search
CPC .......... H01L 21/31111; H01L 27/1052; H01L 21/302; H01L 27/11573
See application file for complete search history.

(56) References Cited

U.S. PATENT DOCUMENTS

| | | | | |
|---|---|---|---|---|
| 5,296,385 | A * | 3/1994 | Moslehi | H01L 21/324 438/514 |
| 6,025,250 | A * | 2/2000 | Ha | H01L 21/302 438/459 |
| 2009/0197355 | A1 * | 8/2009 | Terahara | H01L 21/76224 438/14 |

(Continued)

OTHER PUBLICATIONS

Kirt R. Williams et al., "Etch Rates for Micromachining Processing", Dec. 1996, Journal of Microelectromechanical Systems, vol. 5, No. 4. pp. 256-269.

(Continued)

*Primary Examiner* — Ahmed N Sefer
(74) *Attorney, Agent, or Firm* — Andrew R. Ralston; Charles A. Brill; Frank D. Cimino

(57) ABSTRACT

A method of forming an integrated circuit includes forming a first layer having a first material type over a first side of a semiconductor wafer. A second layer having a second different material type is removed from a second opposing side of the semiconductor wafer using a first process that removes the second material type at a greater rate than the first material type. Subsequent to removing the second layer, the first layer is removed using a second different process.

17 Claims, 9 Drawing Sheets

(56) References Cited

U.S. PATENT DOCUMENTS

| | | | |
|---|---|---|---|
| 2010/0021688 A1* | 1/2010 | Kato | H01L 21/3221 428/141 |
| 2010/0123221 A1* | 5/2010 | Nguyen | H01L 21/02052 257/632 |
| 2015/0087132 A1* | 3/2015 | Zhang | H01L 21/0209 438/421 |
| 2016/0064403 A1* | 3/2016 | Hagiwara | H01L 29/792 438/296 |
| 2018/0166280 A1* | 6/2018 | Dev | H01L 21/02271 |

OTHER PUBLICATIONS

Kirt R. Williams et al., "Etch Rates for Micromachining Processing—Part II", Dec. 2003, Journal of Microelectromechanical Systems, vol. 12, No. 6, pp. 761-778.

* cited by examiner

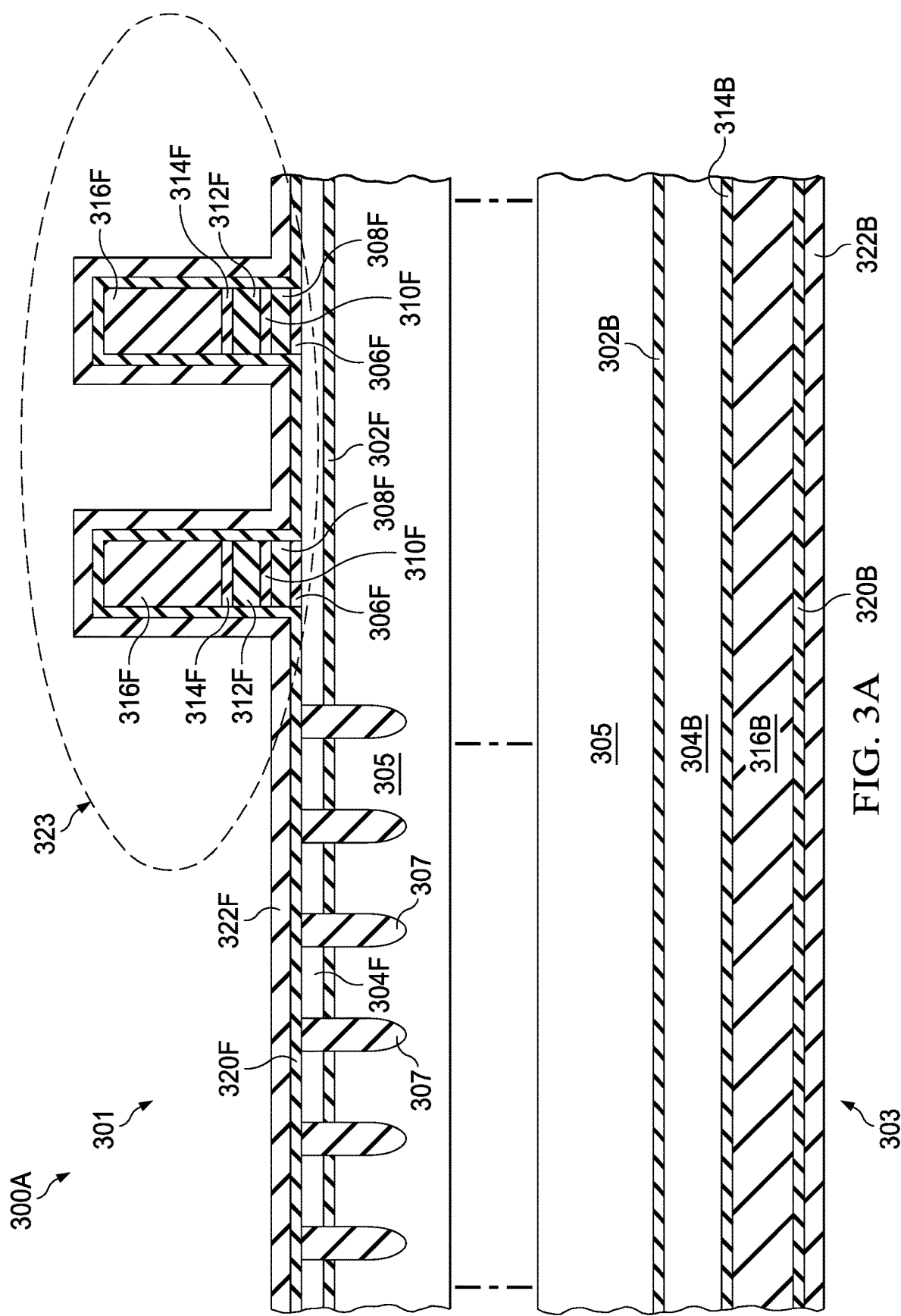

METHOD FOR STRIPPING ONE OR MORE LAYERS FROM A SEMICONDUCTOR WAFER

CROSS REFERENCE TO RELATED APPLICATIONS

This non-provisional application claims priority based upon U.S. provisional patent application No. 62/838,034, filed Apr. 24, 2019, which is hereby incorporated by reference in its entirety.

FIELD OF THE DISCLOSURE

Disclosed implementations relate generally to the field of semiconductor processing. More particularly, and not by way of limitation, the present disclosure is directed to a method for stripping one or more layers from a semiconductor wafer.

SUMMARY

Disclosed implementations provide methods of forming an integrated circuit that utilizes a sacrificial layer—a layer that is deposited and later completely removed—to facilitate removal of one or more undesirable layers on a side of a semiconductor wafer opposing a side on which circuits are formed. The sacrificial layer can protect vulnerable layers and/or features to allow batch processing to be utilized in the removal of the undesirable layers. In instances where multiple layers are being removed, an undesirable layer that has a composition similar to the sacrificial layer may be removed by using a single-wafer tool between successive periods of batch processing. Once the undesirable layer(s) are removed, the sacrificial layer is removed and processing continues. Wafer bow or warp that may have been present prior to removing the undesirable layer(s) may be reduced by the removal. Thus processing issues related to wafer deformation, such as loss of focus or difficulty clamping the wafer, may be reduced or eliminated.

In one aspect, an implementation of a method of forming an integrated circuit is disclosed. The method includes forming a first layer having a first material type over a first side of a semiconductor wafer; removing a second layer having a second different material type from a second opposing side of the semiconductor wafer using a first process that removes the second material type at a greater rate than the first material type; and subsequent to removing the second layer, removing the first layer using a second different process.

In another aspect, an implementation of a method of forming an integrated circuit is disclosed. The method includes depositing a first sacrificial silicon oxide layer over a front-side of a semiconductor wafer using a single-wafer processing tool; immersing the semiconductor wafer in phosphoric acid for a first time period thereby removing a first silicon nitride layer from a backside; and following removal of the first silicon nitride layer, immersing the semiconductor wafer in dilute hydrofluoric acid for a second time period thereby removing the first sacrificial silicon oxide layer.

In yet another aspect, an implementation of a method of forming an integrated circuit is disclosed. The method includes forming a first material layer over a backside of a wafer; forming a second material layer over a front-side of the wafer, the second material layer having a different chemical composition than the first material layer; immersing the wafer in a chemical bath that preferentially removes the first material layer for a time period sufficient to completely remove the first material layer, and then removing the second material layer; and forming semiconductor device features in or over the front-side following removal of the second material layer.

BRIEF DESCRIPTION OF THE DRAWINGS

Implementations of the present disclosure are illustrated by way of example, and not by way of limitation, in the figures of the accompanying drawings in which like references indicate similar elements. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more exemplary implementations of the present disclosure. Various advantages and features of the disclosure will be understood from the following Detailed Description taken in connection with the appended claims and with reference to the attached drawing figures in which:

FIGS. 3A-3C depict a semiconductor wafer at several stages during the methods of FIGS. 1B and 1C according to a further implementation of the disclosure.

DETAILED DESCRIPTION OF THE DRAWINGS

Figure 1A:
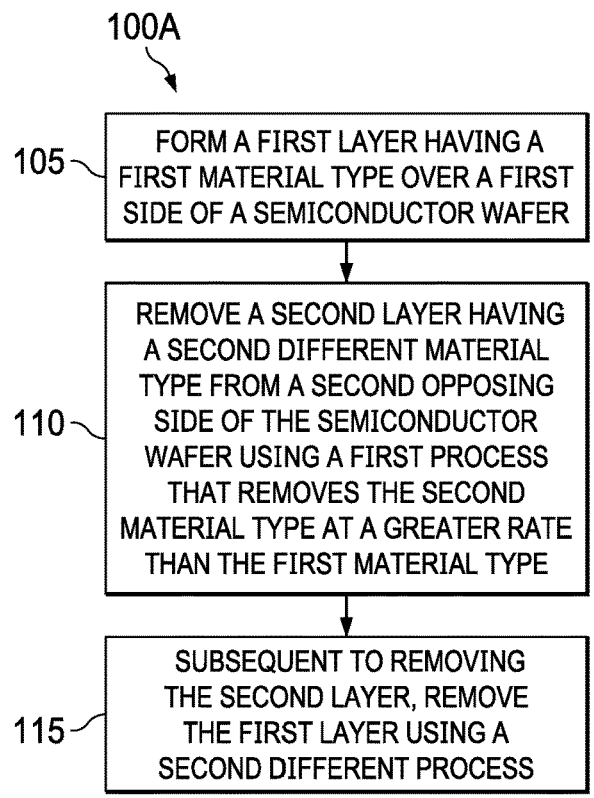
FIG. 1A depicts a flowchart of a method of forming an integrated circuit according to an implementation of the disclosure.

Specific implementations will now be described in detail with reference to the accompanying figures. In the following detailed description, numerous specific details are set forth in order to provide a more thorough understanding. However, it will be apparent to one of ordinary skill in the art that various implementations may be practiced without these specific details. In other instances, well-known features have not been described in detail to avoid unnecessarily complicating the description.

Batch processing tools in semiconductor processing, whether forming new layers or removing existing layers, generally affect both the front-side and the backside of the wafers that are processed, while single-wafer tools are generally able to act on a single side of the wafer, e.g., the front-side. Both types of tools have specific advantages and disadvantages. Herein, the term "front-side" refers to a side of a semiconductor substrate or wafer that includes or prospectively includes semiconductor device features, such as gate electrodes, source/drain regions and interconnects. The term "backside" refers to a side of the semiconductor substrate opposite the front-side. The term "single-wafer tool" refers to a processing tool that operates on a single wafer at a time, thus processing a batch of wafers in serial fashion. The term "batch processing tool" refers to a processing tool that operates on multiple wafers simultaneously.

Single-wafer tools can provide deposition or etching that is limited to specific areas. However, because of the necessity of processing one wafer at a time, these tools are designed for processes that require only a few seconds or minutes on the tool, rather than an hour or a substantial fraction of an hour.

In contrast, batch processing may be much more economical when it can be utilized, since multiple wafers can be processed simultaneously. Batch processing may use reactants that are constantly circulating to maintain reactant levels, resulting in more uniform layers on the semiconductor wafer. Further, because wafers can be etched in batches in an immersion tool, less aggressive etchants can be utilized while still providing the throughput to make the process economically feasible. However, because immersion tools expose both surfaces of the wafer to the etchant, existing structures that have been formed on the wafer front side can be vulnerable to attack from the etchant.

One undesirable side-effect of batch processing is that when one or more layers are deposited on both the front-side and the backside of a wafer, followed by patterning and etching of the front-side to provide desired features, the resulting stress imbalance between the front side and backside surfaces can cause the wafer to bow or warp from stress. When the warpage becomes too large, it becomes difficult or impossible to perform accurate lithography on the wafer. At this point, the backside films may be removed to reduce the warpage before continuing processing.

Other reasons can also play a factor in the desirability of removing backside layers. For example, the backside layer (s) can include silicon nitride, which may contain amines that are basic. The amines may react with chemically amplified photoresist, which is acidic, and partially neutralize the photoresist. This reaction may reduce pattern fidelity, resulting in, e.g., fuzzy patterns. In one example to be discussed herein, the semiconductor wafer contains a silicon nitride layer to be removed from the backside and is in the 65 nm node, where the depth of focus can be affected by this fuzziness. Amine poisoning can also interfere with the formation of gate dielectrics, reduce the quality of the gate dielectric and the uniformity of deposition thickness, and result in the reduction of the electrical quality of the gate dielectric.

Given the desirability of removing these backside layers or films, it is relevant to consider how the backside layers will be removed, e.g., whether in bulk processing or in single-wafer tools, what chemistries are utilized for stripping the backside layers, and what protections are necessary to protect the front-side structures that have been fabricated. An example will be discussed below for the removal of three silicon nitride layers from the backside of a wafer during a manufacturing flow that creates delicate flash memory structures. It will be understood that this example is provided solely for illustration and is not intended as a limitation to the method.

One common method of stripping silicon nitride uses hot phosphoric acid at a temperature range between 120-180° C. No single-wafer tool currently exists that will support hot phosphoric acid. Even if there were, phosphoric acid has a relatively low etch rate of silicon nitride, e.g., less than 7 nm/minute, meaning that for thick silicon nitride films greater than 100 nm, which can be used in a process of forming flash memory, the strip may take 20 minutes or more per wafer. For a single-wafer tool, this process time would result in a prohibitively long and expensive process.

Other chemistries can also be utilized to remove the silicon nitride, e.g., hot hydrofluoric acid at a concentration of forty-nine percent (49%), which can provide a very fast removal rate of a thick silicon nitride layer. However, this chemistry is also extremely aggressive and therefore poses enhanced risk, not only to wafers and processing instruments, but also to humans. Thus, the use of hot hydrofluoric acid may be considered unsuitable in view of health and safety standards. Accordingly, the inventors have determined a process based on less aggressive etch chemistries, designed to protect structures already present on the wafer.

Figure 2A:
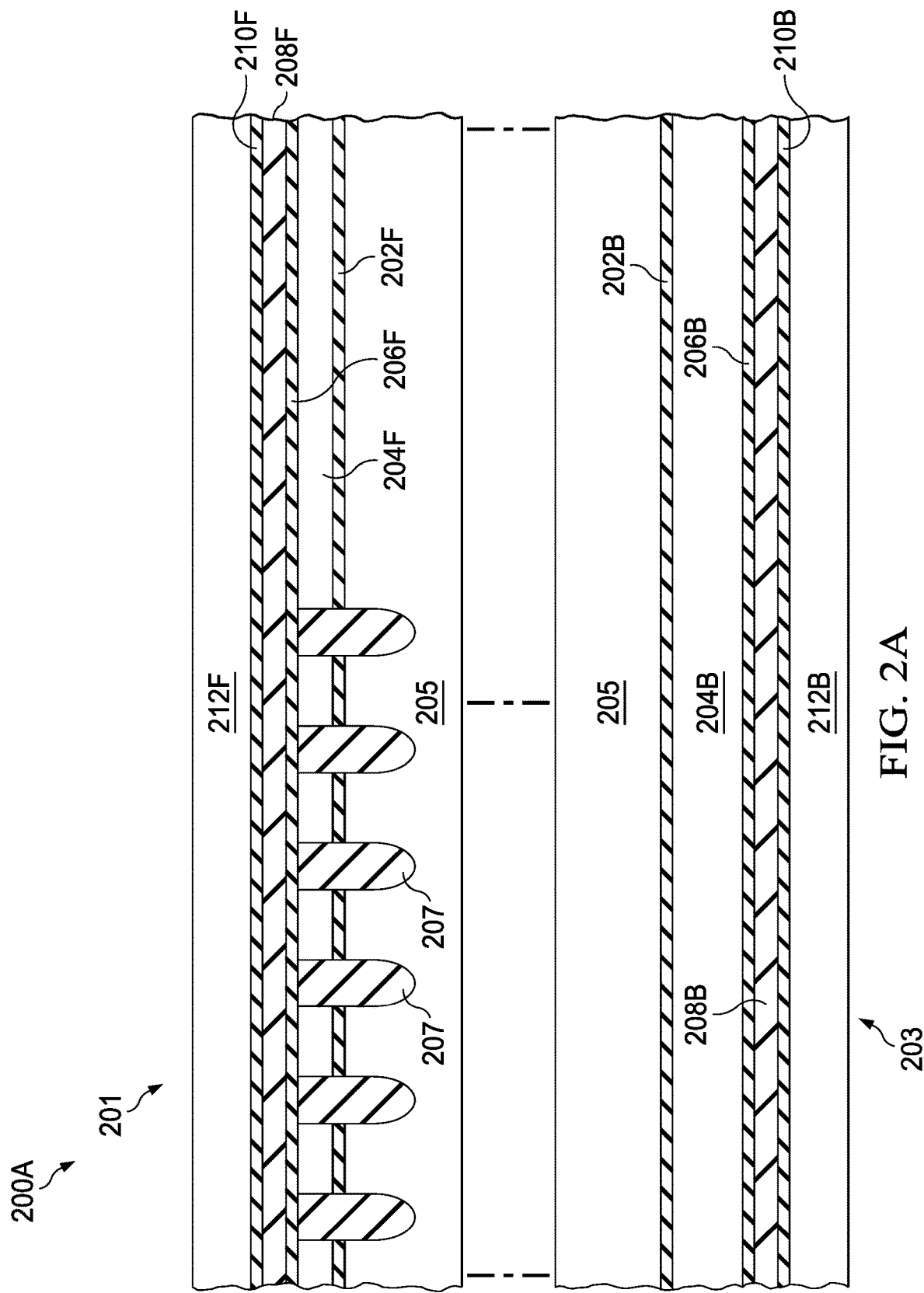
FIGS. 2A-2C depict a semiconductor wafer at several stages during the method of FIG. 1A according to an implementation of the disclosure.

FIG. 2A depicts a semiconductor wafer 200A at one point in the fabrication of a flash memory that is part of an integrated circuit. The example of a flash memory device is provided as an illustrative and non-limiting example. Portions of both the front-side 201 and the backside 203 of semiconductor wafer 200A are shown, while portions of the silicon substrate 205 lying between the two major surfaces are not shown to conserve space in the figures. Some of the layers in the figure end with either an 'F' to denote a front-side layer or a 'B' to denote a backside layer, while reference to the layer without the designation of 'F' or 'B' refers to both the front-side and backside layers. A particular material layer that is present on both the front and back sides may be referred to without the F/B designation when the distinction is not relevant to the discussion. At the stage of manufacturing shown by semiconductor wafer 200A, a silicon oxide layer 202 and polysilicon layer 204 have been formed on silicon substrate 205 and trenches 207 have been etched and filled with silicon oxide on the substrate 205 front-side. Silicon oxide layer 206, silicon nitride layer 208, silicon oxide layer 210, and polysilicon layer 212 have also been formed on the semiconductor wafer. It is noted that some layers, e.g., polysilicon layer 204, may be thinner on the front-side than on the backside. In the example implementation, the fact that layer 204F is thinner than layer 204B is simply evidence of the processing that has been performed on the front-side only, e.g., chemical-mechanical polishing (CMP) or other single-sided processes.

At the stage of fabrication shown by semiconductor wafer 200A, it is desirable to remove silicon nitride layer 208B, which also necessitates the removal of silicon oxide layer 210B and polysilicon layer 212B. While the removal of polysilicon layer 212B and silicon oxide layer 210B can be performed with conventional procedures, the removal of the silicon nitride layer 208B, as well as the removal of later silicon nitride layers presents several problems, especially given that one of the later silicon nitride layers may be about 200 nm thick and may therefore require an hour or more to remove with hot phosphoric acid. Care must be taken to protect the features already present on the front-side 201 of semiconductor wafer 200A.

FIG. 1A depicts a method 100A of forming an integrated circuit, which includes removing a layer, e.g., the silicon nitride layer 208B, from the backside of a semiconductor wafer. Method 100A begins with forming 105 a first layer having a first material type over a first side of the semiconductor wafer. The first layer, which may overlie an entire surface of the semiconductor wafer or may be limited to portions of the first side, is utilized as a sacrificial layer. As used herein, the term "sacrificial layer" refers to a material layer that is temporary in nature when used in a device manufacturing flow and is not present in the final device resulting from the manufacturing flow. In the disclosed implementation, the sacrificial layer is provided to protect the underlying structures from upcoming chemical processing that could otherwise cause harm to the structures. Thus, the sacrificial layer disclosed herein enables batch chemical processing of the semiconductor wafer. In one implementation, the first material type that forms the sacrificial layer is silicon oxide, although the type of material that is used for the sacrificial layer will in general depend on the etchant to be used and may further depend on the layers that are left exposed on the surfaces of the semiconductor wafer. In one implementation, the first layer is provided over the entire front-side of semiconductor wafer 200A, although this is not a limitation of the method. In one implementation, the first layer may be formed on a surface of the semiconductor wafer, then patterned and etched so that the selected portions are protected while remaining portions of the semiconductor wafer are exposed to the chemical processing.

Figure 2B:
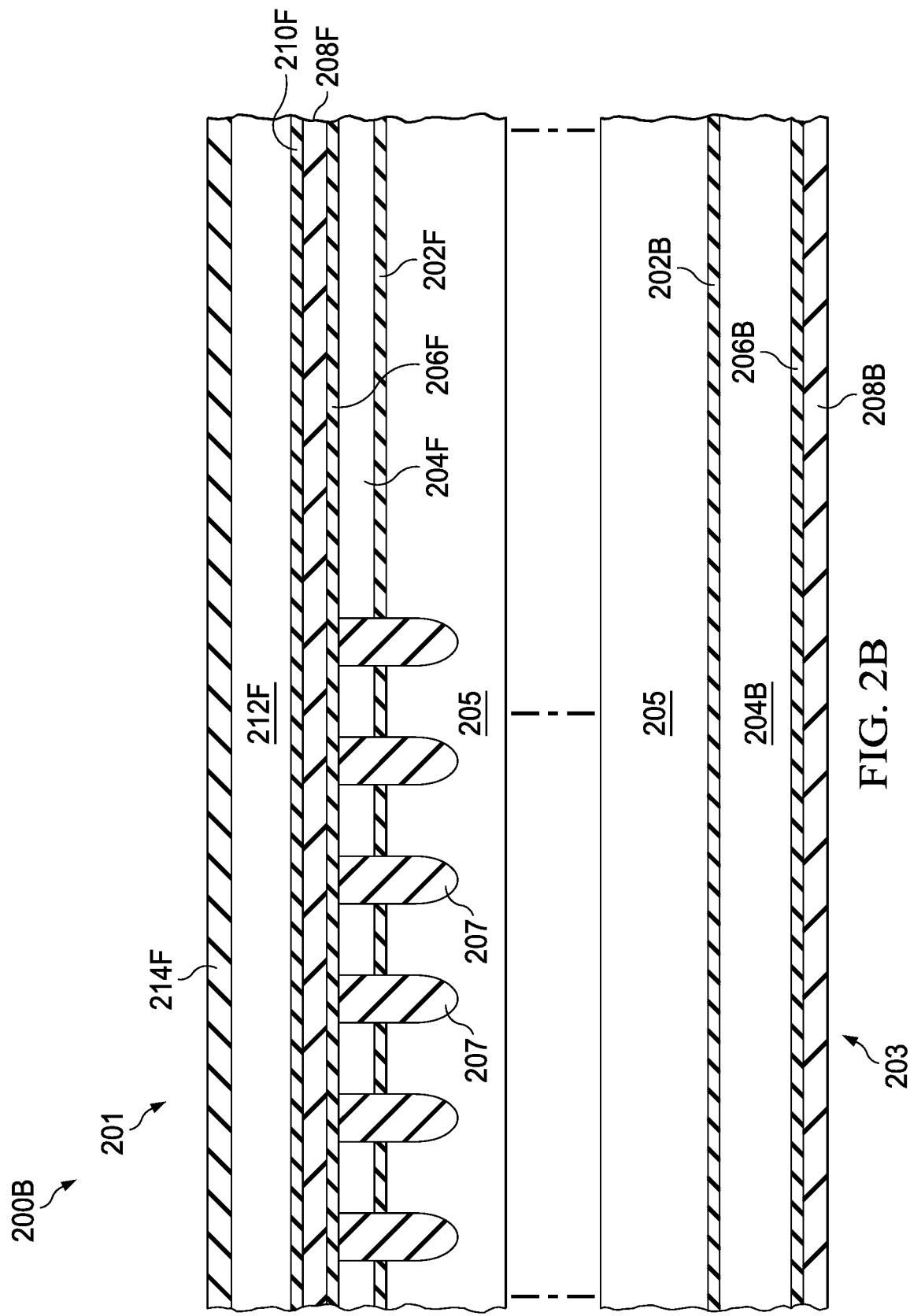

FIG. 2B depicts semiconductor wafer 200B after a first layer, which in this example is sacrificial silicon oxide layer 214F, has been deposited on the front-side 201 of the semiconductor wafer. It is noted that prior to deposition of sacrificial silicon oxide layer 214F, both polysilicon layer 212B and silicon oxide layer 210B have been removed, which may be performed by conventional processing. In one implementation, sacrificial silicon oxide layer 214F is a plasma-enhanced oxide layer (PEOX) that is deposited in a single-wafer tool by plasma-enhanced chemical vapor deposition (PECVD) to a depth of about 50 nm. Sacrificial silicon oxide layer 214F is selected to be resistant to phosphoric acid which can then be utilized to remove silicon nitride from the backside of the wafer in batch processing.

Returning to FIG. 1A, method 100A continues with removing 110 a second layer having a second different material type from a second opposing side of the semiconductor wafer using a first process that removes the second material type at a greater rate than the first material type. Because the first layer is protecting the first side of the wafer, batch chemical processing can be utilized to remove the second layer from the second side of the wafer, e.g., to remove silicon nitride layer 208B from the wafer backside. The batch chemical processing can encompass any suitable processing in which both major surfaces of the semiconductor wafers are exposed to the chemical processing, but in which only regions not covered by the first layer, e.g., the sacrificial silicon oxide layer 214F, are significantly affected by the chemical processing. In the specific described example, the batch chemical processing includes the removal of a first nitride layer, e.g., the silicon nitride layer 208B, which may be removed by immersion in phosphoric acid ($H_3PO_4$) for a first period of time that is between six and eight minutes. In one implementation, the phosphoric acid is at a temperature of approximately 120° C. The front-side 201 is protected during this immersion process by the presence of the sacrificial silicon oxide layer 214F. Some of the first layer 214F may be being consumed in the immersion process, but a sufficient remaining thickness is expected to protect the first side of the wafer throughout the method stage 110.

Method 100A continues with removing 115 the first layer using a second different process. The second different process may be any process suitable to the material of the first layer, which in this example is sacrificial silicon oxide layer 214F extending across the front-side 201 of semiconductor wafer 200B. The silicon wafer can be immersed in dilute hydrofluoric acid for a period of about five minutes. In this implementation, the immersion of semiconductor wafer 200B for the removal of sacrificial silicon oxide layer 214F also removes silicon oxide layer 206B. It will be understood that when a different type of sacrificial layer is utilized, different removal procedures may be utilized.

Figure 2C:
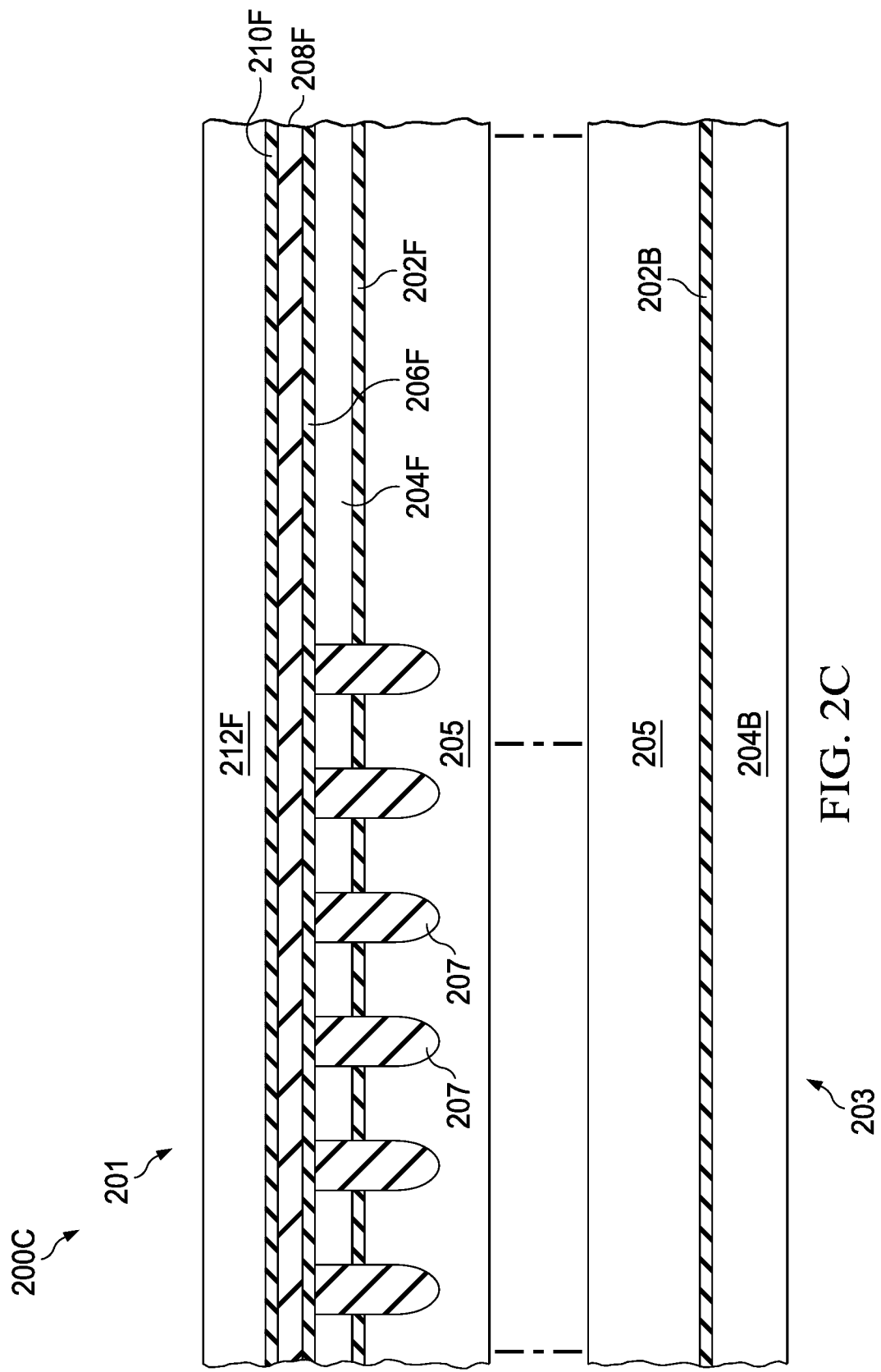

FIG. 2C depicts the semiconductor wafer 200C after the removal of the first layer, e.g., sacrificial silicon oxide layer 214F, has been completed. It can be seen from this figure that the front-side 201 of semiconductor wafer 200C is the same as the front-side 201 of semiconductor wafer 200A while silicon oxide layer 206B, silicon nitride layer 208B, silicon oxide layer 210B, and polysilicon layer 212B have each been removed from semiconductor wafer 200C.

Figure 3B:
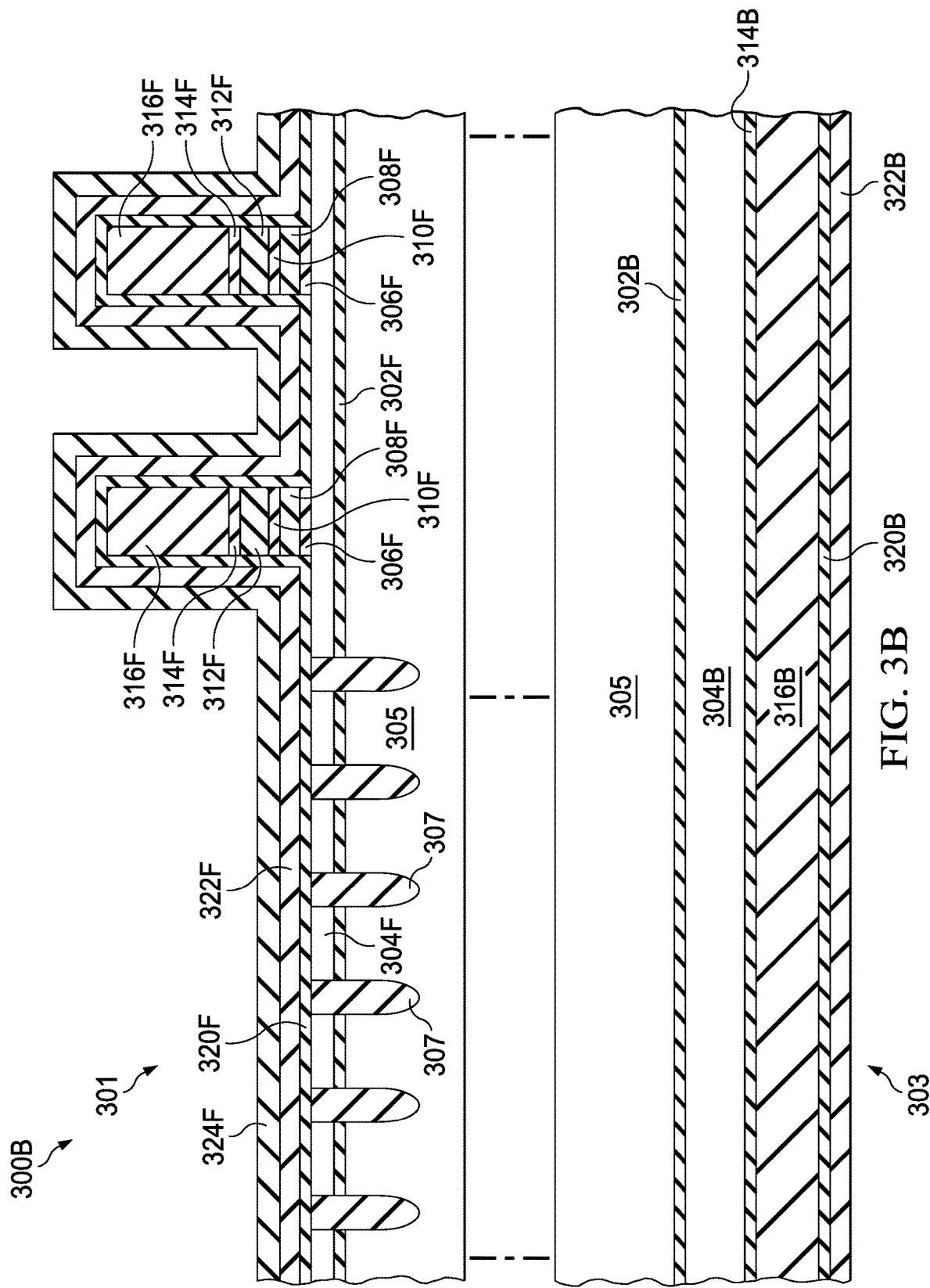
Figure 3C:
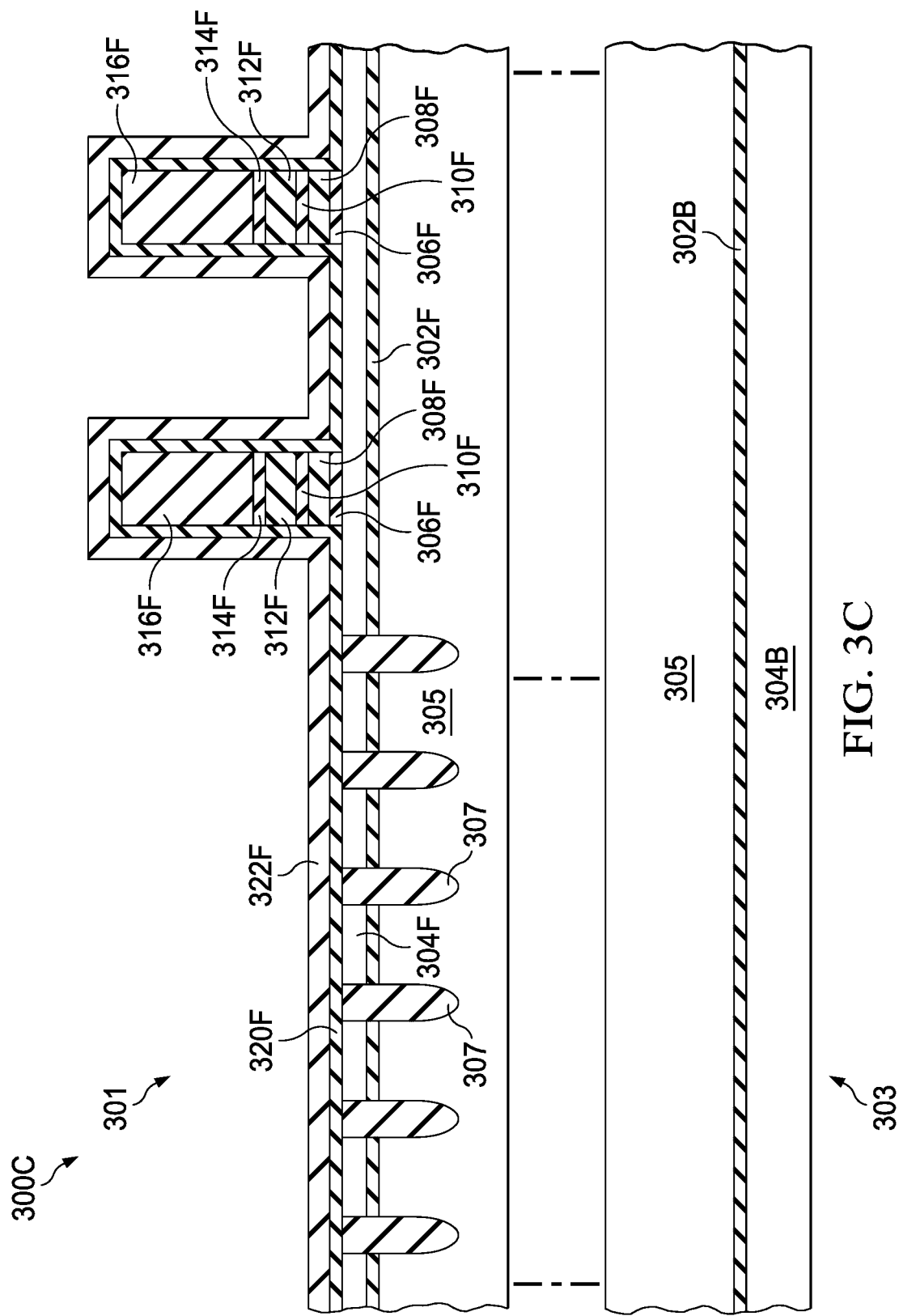

A process similar to method 100A can be performed multiple times on a semiconductor wafer and can be extended to incorporate additional elements into the method. FIGS. 3A-3C illustrate an example of a repetition of the method being utilized. FIG. 3A depicts semiconductor wafer 300A. Semiconductor wafer 300A may be the same wafer as semiconductor wafer 200C, but at a later stage in the fabrication. As seen in semiconductor wafer 300A, trenches 307, silicon substrate 305, silicon oxide layer 302 and polysilicon layer 304 each correspond respectively to trenches 207, silicon substrate 205, silicon oxide layer 202 and polysilicon layer 204. Silicon oxide 306F, silicon nitride 308F, silicon oxide 310F and polysilicon 312F each correspond to remaining portions of silicon oxide layer 206F, silicon nitride layer 208F, silicon oxide layer 210F and polysilicon layer 212F, while other portions of these original layers have been removed during the formation of flash memory cells 323. The flash memory cells 323 also include portions of silicon oxide layer 314 and silicon nitride layer 316, which were formed after the stage shown in FIG. 2C, while silicon oxide layer 320 and silicon nitride layer 322 are present overlying both surfaces of semiconductor wafer 300A. Silicon nitride layer 316 in particular may be quite thick, and its removal from the backside 303 may be needed to reduce warpage. In one implementation, silicon nitride layer 316 is about 200 nm thick, which requires about an hour for removal during batch processing in phosphoric acid, making single-wafer processing even more economically infeasible.

Because semiconductor wafer 300A contains two silicon nitride layers 316B, 322B that need to be removed, as well as an intervening silicon oxide layer 320B, removal of these layers utilizes an additional sacrificial layer. Method 100B shown in FIG. 1B begins with forming 130 a third layer having the first material type over the first side. In one implementation, the third layer is also formed across the entire front-side 301 of semiconductor wafer 300A.

FIG. 3B depicts semiconductor wafer 300B after a third layer, which in this example is sacrificial silicon oxide layer 324F, has been deposited on the front-side 301 of the semiconductor wafer 300B. Because of the topology present in this example, sacrificial silicon oxide layer 324F comprises a conformal silicon oxide that is deposited in a single-wafer tool by rapid thermal processing (RTP) chemical vapor deposition (CVD) to a thickness of about 40 nm.

Method 100B continues with removing 135 a fourth layer having the second different material type from the second opposing side of the semiconductor wafer using the first process. In one implementation, the fourth layer is a nitride layer, e.g., silicon nitride layer 322B, which in one example is removed by immersing the semiconductor wafer 300B in phosphoric acid at a temperature of approximately 160° C. for a first period of time determined by the thickness of the silicon nitride layer 322B, e.g., between about six minutes and about eight minutes. The front-side is protected during this immersion process by the presence of the third layer, e.g., sacrificial silicon oxide layer 324F, with some but not all of this layer being consumed during the first process. Method 100B continues with removing 140 the third layer using the second different process, which in one implementation is immersion in dilute hydrofluoric acid for a period sufficient to remove the third layer, e.g., about five minutes.

Figure 1B:
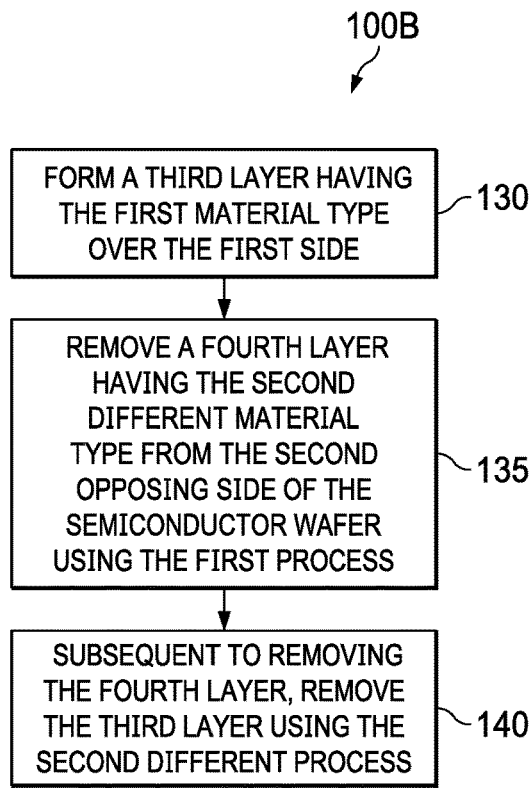
FIGS. 1B and 1C depict additional elements that may be incorporated into the flowchart of FIG. 1A according to an implementation of the disclosure.

The method of stripping backside layers using a sacrificial layer on the front-side can be repeated in essentially the same manner, as disclosed in FIGS. 1A and 1B. However, in the implementation shown in FIG. 3B, once the fourth layer, e.g., silicon nitride layer 322B is removed, an additional thick layer of silicon nitride 316B still needs to be removed, but is covered by silicon oxide layer 320B, which has the same material type as the example third layer, e.g., sacrificial silicon oxide layer 324F. In order to maintain the third layer for use in the removal of silicon nitride layer 316B, a single wafer tool can be utilized to remove a much thinner backside layer.

Figure 1C:
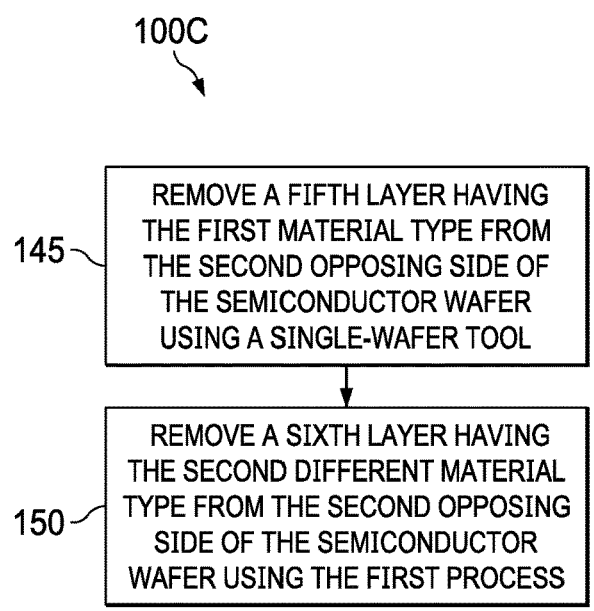

For the implementation shown in FIG. 3B, method 100C shown in FIG. 1C can be inserted into method 100B subsequent to removal of the fourth layer and prior to removal of the third layer. Although method 100C is discussed as being inserted into a second repetition of the disclosed method, in one embodiment, method 100C may also be inserted into method 100A. Method 100C begins with removing 145 a fifth layer having the first material type from the second opposing side of the semiconductor wafer using a single-wafer tool. Processing on a single-wafer tool can remove a next layer that has the same or similar composition as the sacrificial layer, while leaving the sacrificial layer intact. In one example, silicon oxide layer 320B is removed using dilute hydrofluoric acid in a single-wafer cleaning tool. The method then continues with removing 150 a sixth layer having the second different material type from the second opposing side of the semiconductor wafer using the first process. In the example disclosed herein, the sixth layer is silicon nitride layer 316B, which is removed using a further immersion in phosphoric acid. Because of the thickness of silicon nitride layer 316B, semiconductor wafer 300B is immersed in phosphoric acid at a temperature of about 160° C. for a period of time that is between about fifty minutes and about seventy minutes. The front-side is protected during this immersion process by the presence of the third layer, e.g., sacrificial silicon oxide layer 324F, with some, but not all, of the third layer remaining after the removal of the sixth layer. Because silicon nitride layer 316B is removed in the example of method 100C, when the third, sacrificial layer is removed, a remaining backside layer of the same material type, e.g., silicon oxide layer 314B, may also be removed. It will be understood that when a different type of sacrificial layer is utilized, different removal procedures can be utilized.

FIG. 3C depicts the semiconductor wafer 300C after the removal of the sacrificial silicon oxide layer 324F has been completed. It can be seen that the front-side 301 of semiconductor wafer 300C is the same as the front-side 301 of semiconductor wafer 300A while silicon oxide layer 314B, silicon nitride layer 316B, silicon oxide layer 320B, and silicon nitride layer 322B have each been removed from semiconductor wafer 300C.

Figure 4A:
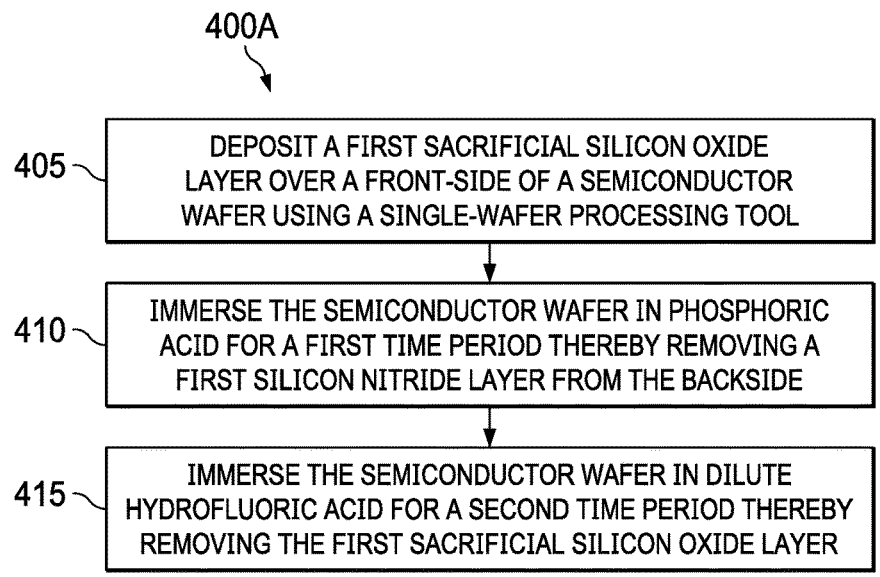
FIG. 4A depicts a flowchart of a method of forming an integrated circuit according to an implementation of the disclosure.
Figure 4B:
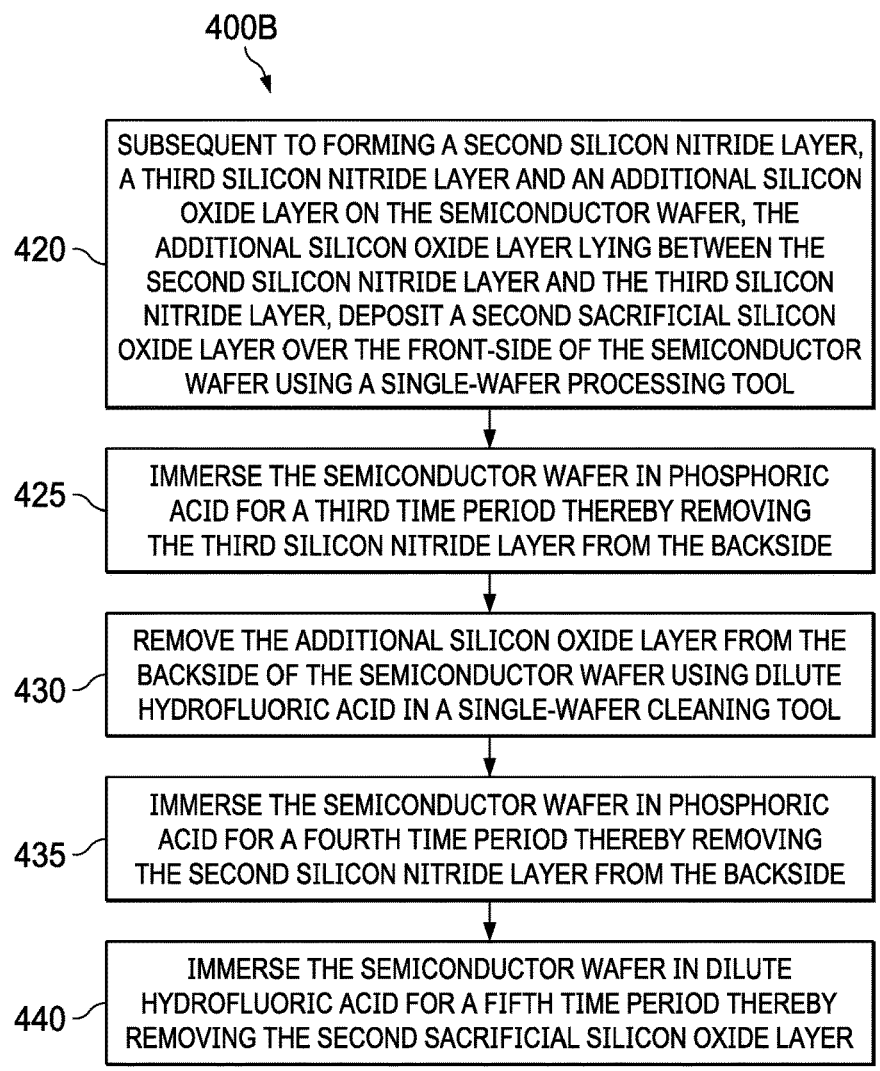
FIG. 4B depicts additional elements that may be incorporated into the flowchart of FIG. 4A according to an implementation of the disclosure.

Although the above description has mentioned only the use of silicon oxide as a sacrificial layer, when other etchants are utilized, other sacrificial materials can be utilized. For example, when hydrofluoric acid is the etchant, either photoresist or a bottom anti-reflective coating (BARC) can be utilized for the sacrificial layer. As used herein, "BARC" refers to an organic material conventionally used to reduce optical reflections during exposure of an overlying photoresist layer. When photoresist or BARC is used as the sacrificial layer, the sacrificial layer can be removed with a plasma ash that uses, for example, oxygen as a reactive agent, or with a wet batch process using a sulfuric acid and hydrogen peroxide mixture, also known as piranha or SPM.

Where FIGS. 1A-1C depict a general method of stripping one or more layers from a semiconductor wafer, FIGS. 4A-4B are provided to depict the specific method utilized in the removal of the silicon nitride layers from semiconductor wafers 200A and 300A. Method 400A of FIG. 4A begins with depositing 405 a first sacrificial silicon oxide layer over a front-side of a semiconductor wafer using a single-wafer processing tool. As previously discussed, first sacrificial silicon oxide layer 214F is deposited on the front-side 201 of semiconductor wafer 200B. Following deposition of the first sacrificial silicon oxide layer 214F, the semiconductor wafer is immersed 410 in phosphoric acid for a first time period, thereby removing a first silicon nitride layer from the backside. This first silicon nitride layer is silicon nitride layer 208B and in one implementation the first time period is about 6-8 minutes. The semiconductor wafer is then immersed 415 in dilute hydrofluoric acid for a second time period thereby removing the first sacrificial silicon oxide layer.

The processes that take place between FIG. 2C and FIG. 3A, e.g. to form the flash memory cells 323, are beyond the scope of the discussion and are omitted. However, it is clear from the figures that a second silicon nitride layer 316, a third silicon nitride layer 322 and an additional silicon oxide layer 320 are formed on the semiconductor wafer between FIG. 2C and FIG. 3A, with the additional silicon oxide layer 320 lying between the second silicon nitride layer 316 and the third silicon nitride layer 322. Subsequent to the formation of the second silicon nitride layer, the additional silicon oxide layer and the third silicon nitride layer, a second sacrificial silicon oxide layer 324F is deposited 420 over the front-side of the semiconductor wafer using a single-wafer processing tool.

The semiconductor wafer is immersed 425 in phosphoric acid for a third time period thereby removing the third silicon nitride layer from the backside. In one implementation, the third time period is about six to about eight minutes. This is followed by removing 430 the additional silicon oxide layer from the backside of the semiconductor wafer using dilute hydrofluoric acid in a single-wafer cleaning tool. Removing the additional silicon oxide layer 320 using a single-wafer cleaning tool is done to preserve the second sacrificial silicon oxide layer 324F so that additional batch processing can be performed. The semiconductor wafer is then immersed 435 in phosphoric acid for a fourth time period thereby removing the second silicon nitride layer from the backside. Because in the disclosed implementation, the second silicon nitride layer 316 is 200 nm thick, the fourth time period is between about fifty (50) and about seventy (70) minutes. This completes the batch processing for which the second sacrificial silicon oxide layer 324F was formed and the semiconductor wafer is immersed 440 in dilute hydrofluoric acid for a fifth time period, thereby removing the second sacrificial silicon oxide layer 324F. It will be understood that while method 400 provides a number of elements that immerse the semiconductor wafer in various etchants, the wafer is not typically taken directly from processing with one etchant to processing with a second etchant. Rinsing of the semiconductor wafer and other cleaning elements are understood to sometimes take place between various elements of the disclosed implementations but are not specifically mentioned.

Figures 5A, 5B:
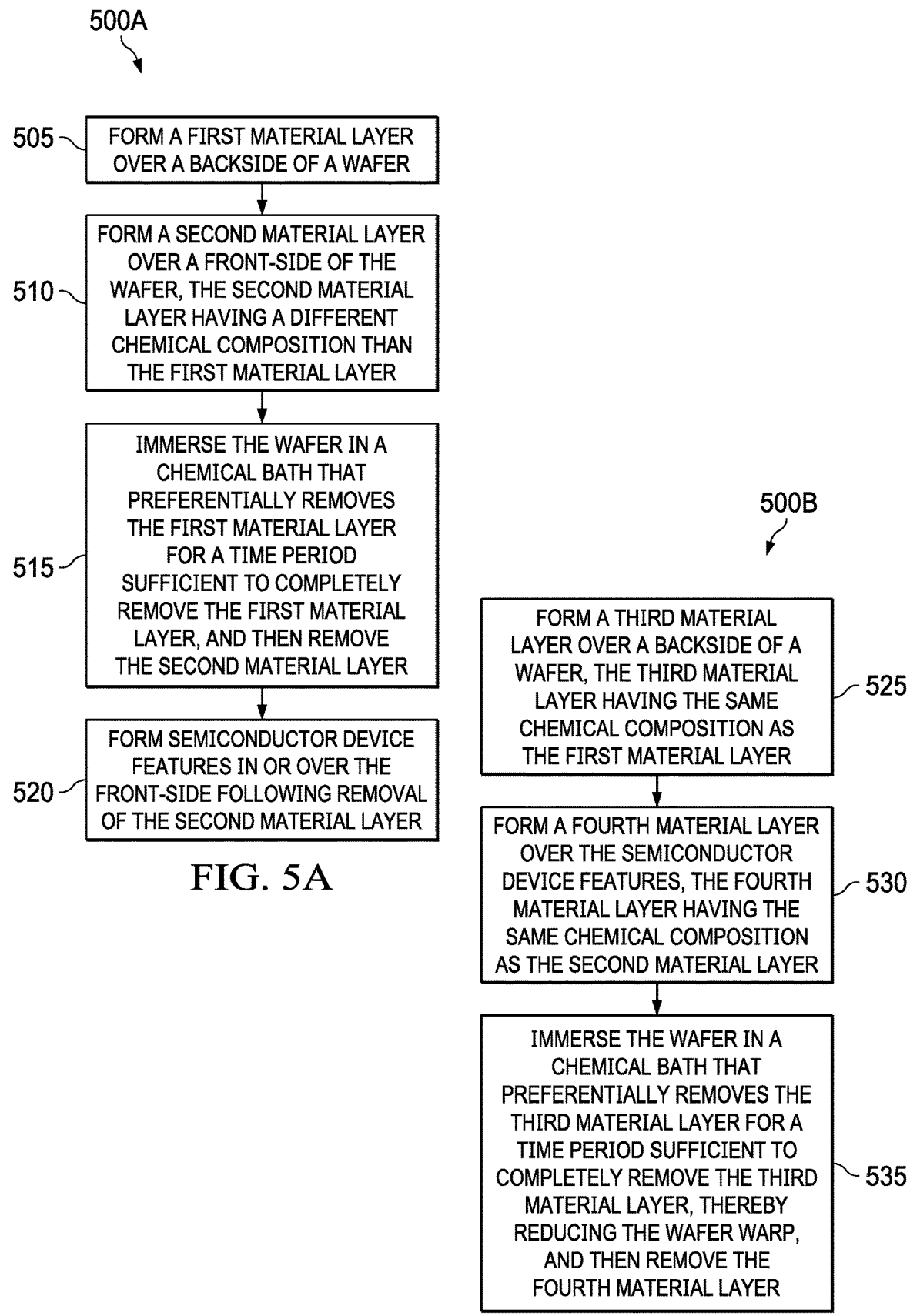
FIG. 5A depicts a flowchart of a method of forming an integrated circuit according to an implementation of the disclosure.
FIG. 5B depicts additional elements that may be incorporated into the flowchart of FIG. 5A according to an implementation of the disclosure.

Method 500A of FIG. 5A provides another expression of the actions that can be used to remove a layer from a semiconductor wafer and method 500B of FIG. 5B depicts further actions that may be added to method 500A. Method 500A begins with forming 505 a first material layer over a backside of a wafer, e.g., the formation of silicon nitride layer 208B or the formation of silicon nitride layer 316B and continues with forming 510 a second material layer over a front-side of the wafer, the second material layer having a different chemical composition than the first material layer. In one implementation, the second material layer is sacrificial silicon oxide layer 214F. The wafer is then immersed 515 in a chemical bath that preferentially removes the first material layer for a time period sufficient to completely remove the first material layer, and then the second material layer is removed. Semiconductor device features are formed 520 in or over the front-side following removal of the second material layer.

In one implementation, method 500A can be followed by method 500B, which begins with forming 525 a third material layer over a backside of a wafer, the third material layer having the same chemical composition as the first material layer and continues with forming 530 a fourth material layer over the semiconductor device features, the fourth material layer having the same chemical composition as the second material layer. In one example, the third material layer is silicon nitride layer 322B and the fourth material layer is sacrificial silicon oxide layer 324F. The wafer is immersed 535 in a chemical bath that preferentially removes the third material layer for a time period sufficient to completely remove the third material layer, thereby reducing the wafer warp, and then removing the fourth material layer.

Applicants have disclosed the use of a sacrificial layer that is provided solely to enable batch processing of semiconductor wafers to remove undesirable layers, which may be backside layers that were formed using batch processing. Despite the additional processing necessary to form and then remove a sacrificial layer, enabling batch processing to remove one or more backside layers can still provide an overall savings in processing time, especially when one or more layers are thick and/or require extended processing time. The disclosed method can provide a desirable throughput without resorting to extremely aggressive chemistries that can cause inadvertent damage to the semiconductor wafer, the associated tools and humans involved in the processing. The method is also effective in protecting topography that has already been formed while removing unnecessary layers that can cause warpage, problems with lithography and unintended chemical reactions.

Although various implementations have been shown and described in detail, the claims are not limited to any particular implementation or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims. Accordingly, those skilled in the art will recognize that the exemplary implementations described herein can be practiced with various modifications and alterations within the spirit and scope of the claims appended below.

What is claimed is:

1. A method of forming an integrated circuit, comprising:
   forming a first layer having a first material type over a first side of a semiconductor wafer;
   removing a second layer having a second different material type from a second opposing side of the semiconductor wafer using a first process that removes the second material type at a greater rate than the first material type;
   subsequent to removing the second layer, removing the first layer using a second different process;
   forming a third layer having the first material type over the first side;
   removing a fourth layer having the second different material type from the second opposing side of the semiconductor wafer using the first process; and
   subsequent to removing the fourth layer, removing the third layer using the second different process.

2. The method as recited in claim 1 wherein forming the first layer comprises depositing a sacrificial silicon oxide layer over a front-side of the semiconductor wafer using a single-wafer tool.

3. The method as recited in claim 2 wherein the sacrificial silicon oxide layer is deposited to a thickness between 40 nm and 50 nm.

4. The method as recited in claim 1 wherein removing the second layer comprises performing a batch chemical process that immerses the semiconductor wafer in phosphoric acid for a first period of time to remove a silicon nitride layer.

5. The method as recited in claim 1 wherein removing the first layer comprises immersing the semiconductor wafer in dilute hydrofluoric acid in a batch chemical process.

6. The method as recited in claim 1 further comprising, prior to removing the third layer:
   removing a fifth layer having the first material type from the second opposing side of the semiconductor wafer using a single-wafer tool; and
   removing a sixth layer having the second different material type from the second opposing side of the semiconductor wafer using the first process.

7. The method as recited in claim 1 wherein forming the first layer comprises depositing an organic coating over a front-side of the semiconductor wafer.

8. The method as recited in claim 1 wherein forming the first layer comprises depositing a photoresist over a front-side of the semiconductor wafer.

9. A method of forming an integrated circuit, comprising:
   depositing a first sacrificial silicon oxide layer over a front-side of a semiconductor wafer using a single-wafer processing tool;
   immersing the semiconductor wafer in phosphoric acid for a first time period thereby removing a first silicon nitride layer from a backside;

following removal of the first silicon nitride layer, immersing the semiconductor wafer in dilute hydrofluoric acid for a second time period thereby removing the first sacrificial silicon oxide layer;

subsequent to forming a second silicon nitride layer, a third silicon nitride layer and an additional silicon oxide layer, the additional silicon oxide layer lying between the second silicon nitride layer and the third silicon nitride layer, depositing a second sacrificial silicon oxide layer over the front-side of the semiconductor wafer using a single-wafer processing tool;

immersing the semiconductor wafer in phosphoric acid for a third time period thereby removing the third silicon nitride layer from the backside;

removing the additional silicon oxide layer from the backside of the wafer using dilute hydrofluoric acid in a single-wafer cleaning tool;

immersing the semiconductor wafer in phosphoric acid for a fourth time period thereby removing the second silicon nitride layer from the backside; and following removal of the second silicon nitride layer, immersing the semiconductor wafer in dilute hydrofluoric acid for a fifth time period thereby removing the second sacrificial silicon oxide layer.

10. A method of forming an integrated circuit, comprising:
forming a first material layer over a backside of a wafer;
forming a second material layer over a front-side of the wafer, the second material layer having a different chemical composition than the first material layer;
immersing the wafer in a chemical bath that preferentially removes the first material layer for a time period sufficient to completely remove the first material layer, and then removing the second material layer;
forming semiconductor device features in or over the front-side following removal of the second material layer;
forming a third material layer over a backside of a wafer, the third material layer having the same chemical composition as the first material layer;
forming a fourth material layer over the semiconductor device features, the fourth material layer having the same chemical composition as the second material layer; and
immersing the wafer in a chemical bath that preferentially removes the third material layer for a time period sufficient to completely remove the third material layer, thereby reducing wafer warp, and then removing the fourth material layer.

11. The method as recited in claim 10 wherein the first material layer comprises silicon nitride.

12. The method as recited in claim 10 wherein the second material layer comprises silicon oxide.

13. The method as recited in claim 10 wherein removing the second material layer also removes the third material layer located over the wafer backside.

14. The method as recited in claim 10, wherein removing the first material layer reduces warping of the wafer.

15. The method as recited in claim 10, wherein removing the third material layer reduces warping of the wafer.

16. The method as recited in claim 10 wherein the second material layer comprises a photoresist or a bottom anti-reflective coating (BARC)wafer.

17. A method of forming an integrated circuit, comprising:
forming a first material layer over a backside of a wafer;
forming a second material layer over a front-side of the wafer, the second material layer having a different chemical composition than the first material layer;
immersing the wafer in a chemical bath that preferentially removes the first material layer for a time period sufficient to completely remove the first material layer, and then removing the second material layer;
forming semiconductor device features in or over the front-side following removal of the second material layer,
wherein removing the second material layer also removes a third material layer located over the wafer backside, the third material layer having the same chemical composition as the second material layer.

* * * * *